June 15, 1965 F. P. HILL 3,189,824

NOISE SUPPRESSORS FOR RADIO RECEIVERS

Original Filed Oct. 23, 1956

INVENTOR.
Frederick P. Hill
BY
Mueller and Aichele
Attys.

United States Patent Office
3,189,824
Patented June 15, 1965

3,189,824

NOISE SUPPRESSORS FOR RADIO RECEIVERS

Frederick P. Hill, Elgin, Ill., assignor to Motorola, Inc., Chicago, Ill., a corporation of Illinois Continuation of application Ser. No. 617,775, Oct. 23, 1956. This application Jan. 9, 1961, Ser. No. 81,635
4 Claims. (Cl. 325—319)

This invention relates to noise suppressors for auto radio receivers, and more particularly to audio noise suppressors for radio receivers using a transistor and operating directly from the battery voltage. This application is a continuation of application Serial No. 617,775, filed October 23, 1956, and now abandoned.

Radio receivers employing transistor audio amplifiers when used in automobiles are affected by various noise sources on the "A" or power supply line which leads from the battery directly to the transistor. One of the main sources of noise in such sets when used in automobiles comes from the breaker points in the automobile ignition system. Such noise when transmitted to the transistor amplifier causes noise bursts which are audible in the speakers of the sets and is highly undesirable. A filter for filtering audio frequency noise may be provided between such a transistor amplifier and the power supply but such a filter of a practical size is not entirely satisfactory to eliminate such noise.

In radio sets of the type supplied with power from the battery of the automobile through a vibrator, a step up transformer and a rectifier and filter, the noise sources are isolated by these latter components very effectively so that noise is not transmitted on to the radio set proper. However, in hybrid receiver sets, which utilize low voltage vacuum tubes and a transistor in the audio stage, or all transistor radios, the stages are usually connected directly to the battery generator through only simple filtering means, such as a choke coil and a capacitor. In such receivers noise from the power supply appears in the audio frequency portion of the radio circuit. The use of choke coils and capacitors of sufficient capacity to eliminate the noise in the audio frequency stage and the speaker are both quite large and expensive and are undesirable for this reason.

An object of the invention is to provide new and improved noise suppressor circuits for radio receivers.

Another object of the invention is to provide an audio system for automobile radio receivers wherein noise picked up in the receiver is balanced out.

A further object of the invention is to provide noise suppressors for low voltage automobile radio receivers which are operated directly from the automobile battery.

A feature of the invention is the provision of an automobile radio receiver having an audio stage including a noise suppressing coil for balancing out noise originating in the power supply.

Another feature of the invention is the provision of a low voltage radio receiver coupled directly to a power supply to which is connected leads containing noise, and in which the receiver includes an audio output stage provided with compensating coils through which the power passes and which eliminate the noise.

A further feature of the invention is the provision of a radio receiver energized from a voltage source which includes a noise component, in which a coupling transformer in the audio output of the receiver includes a noise suppression winding through which the noise components of the power supply are applied in opposing phase relation to the noise components on the signal so that the noise components are balanced out.

A still further feature is the provision of a radio receiver energized from a voltage source having noise components therewith in which a suppressor winding is inductively coupled to the voice coil of the loudspeaker and to which the noise components of the power supply are applied, with the suppressor coil inducing noise components in the speaker coil in opposite phase to the components supplied with the audio signal so that the noise components are balanced out. In such case, the suppressor coil may be connected to the power supply in series with the audio stage of the receiver or in parallel therewith. Also, the direct current may be applied to the suppressor coil for use as a field for the speaker or only the noise pulses may be applied with the direct current removed.

Figures 1, 2, 3, 4, 5:
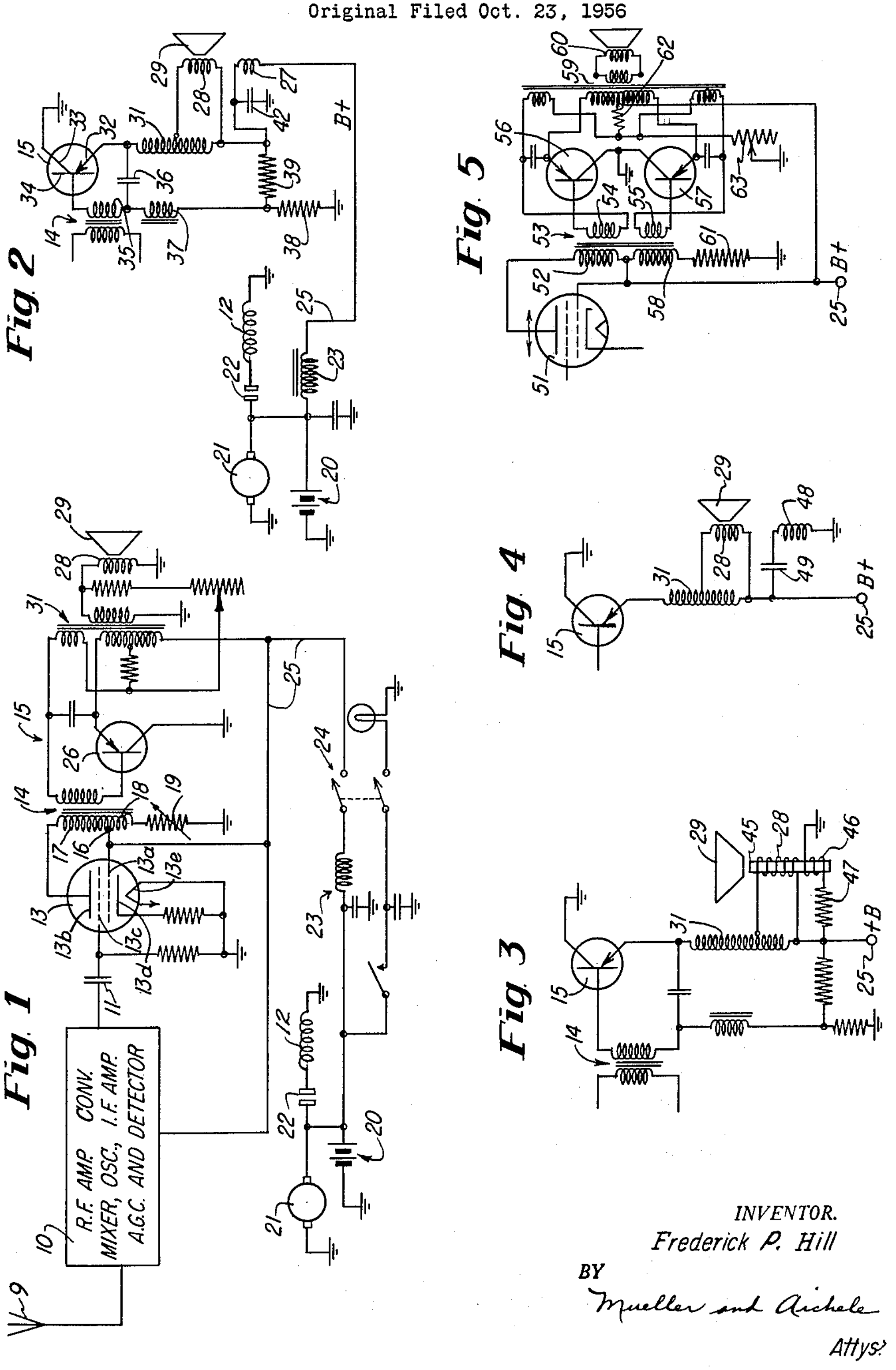
FIG. 1 is a diagram of a radio receiver including a noise suppressor circuit forming one embodiment of the invention.
FIG. 2 is a diagram of a radio receiver circuit including a noise suppressor circuit forming another embodiment of the invention.
FIGS. 3, 4 and 5 are diagrams of the audio output portions of radio receiver circuits including noise suppressor circuits forming other embodiments of the invention.

In accordance with the invention, automobile radio receivers are provided with noise suppressor circuits for eliminating noise supplied to output stages of the receivers directly from the battery generator power source. One principal source of such noise is the automobile breaker points which are connected in parallel with the battery.

The audio output may include a transistor stage designed to be energized directly by the battery-generator voltage source. The output of the transistor stage supplies a voice coil of a speaker, and any noise which may be in the power supply tends to be reproduced thereby. The receiver in accordance with the invention includes a coil through which the noise components of the power supply are applied and which is placed in inductive relation to a coil of the output stage to induce therein noise components in phase opposition to the noise components applied with the audio signal. This balances out the noise components so they are not reproduced by the receiver. Such noise suppression may be provided by an additional winding on a coupling transformer which induces the noise components in the secondary winding in phase opposition to the noise components induced therein by the audio primary winding. The suppressor coil may also be placed in the loudspeaker to induce noise components in the voice coil of the speaker in phase opposition to the noise components supplied thereto with the audio signal. The suppressor coil may be energized from the power source in series with the audio stage of the receiver or in parallel therewith, and the direct current voltage of the source as well as the noise components may be supplied, or only the noise components with the direct current being blocked.

In a radio receiver forming one embodiment of the invention shown in FIG. 1, there is provided a radio frequency amplifier, a converter, one or more intermediate frequency amplifiers and a detector, all illustrated by a block 10. The radio frequency amplifier may be supplied with signals from an antenna 9. The signal is transmitted through the stages shown by the block 10 and through a coupling capacitor 11 to an audio frequency amplifier stage 13 from which the amplified audio signal is supplied through a transformer 14 to a transistor power amplifier stage 15. The entire radio is supplied with B-plus power from the battery 20 and generator 21 of the automobile which supply a D.C. voltage of from about 11 volts to about 15 volts, nominally a 12 volt D.C. voltage source. Normally, of course, the generator 21 supplies the power, and during operation of the automobile supplies power through the breaker points 22 to the induction coil 12 of the automobile which imposes a pulsating signal of variable frequency (noise) into the power supply lines from the battery and generator. The D.C. power passes through a filter network 23 and a switch 24 to B-plus power supply conductor 25.

The audio frequency amplifier stage 13 is of the space charge type including a signal grid 13*c* to which the signal from capacitor 11 is applied. The B-plus potential is applied to a space charge grid 13*a* and to a tap 16 of a primary winding of a transformer 14 which is connected to a plate 13*b* of the tube 13. The tube 13 also includes a cathode 13*d* and a heater 13*e*. The primary of transformer 14 includes sections 17 and 18, and a variable resistor 19 connects the winding 18, to ground.

When no signal is applied to the grid 13*c*, the ampere-turns of the winding 18 are equal and opposite to the ampere-turns of the winding 17. Hence, noise from the power source is cancelled, and the fields produced by direct current from the power supply are also cancelled. However, the output signal from the tube 13 is applied to the winding 17 and is not affected by the current in winding 18. Thus, the signal fed to a transistor 26 by the transformer 14 is noise free. This signal is amplified in the transistor output stage and applied through transformer 31 to the voice coil 28 of a loudspeaker 29.

In the embodiment shown in FIG. 2, an audio output circuit is provided in which noise cancellation is produced at the loudspeaker instead of at a coupling transformer. Operating potentials are applied from the automobile battery-generator through a conductor 25 which provides the B-plus potential for the transistor power stage 15. Current for operating the stage is supplied from the conductor 25 through noise suppressing coil 27 mounted in the vicinity of and in inductive relationship with the voice coil 28 of speaker 29. Current through the coil 27 is applied through an output autotransformer 31 to the emitter 32 of the transistor. The voice coil 28 is tapped to the transformer 31 to obtain suitable driving voltage for the speaker 29. The transistor collector 33 is grounded to complete the output circuit thereof, and the input circuit is completed by condenser 36. Current through coil 27 is also applied to resistors 38 and 39 which form a voltage divider, with the divided voltage being applied through choke coil 37 to the emitter 32 to bias the same.

In the operation of the output stage shown in FIG. 2, the signal applied through the transformer 14 includes noise components from the power supply. The audio signal is amplified by the transistor stage 15 and fed through the autotransformer 31, with the signal being applied in amplified condition to the voice coil 28 as is well known in the art. The noise components from the power supply also travel through the suppressor coil 27 which is in series in the power supply line. The suppressor coil 27 is in inductive relation with the voice coil 28 and has opposite polarity so that the noise components in the coil 28 are cancelled by the noise components in the coil 27. The audio signals in the noise suppressing coil 27 have much less effect than those of the voice coil 28 and therefore do not substantially cancel the audio signals supplied to the voice coil 28. However, as to noise components, the ampere-turns in the suppressor coil 27 are sufficiently high that noise components in the coil 28 are effectively cancelled and suppressed thereby. The suppressor coil 27 may be connected by a capacitor 42 to ground to reduce the impedance of the path for the noise components and thereby increase the effectiveness of the coil 27 for noise cancellation.

In the embodiment shown in FIG. 3, there is shown a power amplifier transistor stage of a radio circuit generally similar to that shown in FIG. 2. This circuit includes a transformer 14 supplying the amplified audio signal with noise imposed thereon to a transistor amplifier output stage 15. The output of the stage 15 is provided by an autotransformer 31 connected to B-plus terminal 25. The signal from the transformer 31 is applied to the voice coil 28 of the loudspeaker 29. The speaker includes a magnetic core 45 producing a field in which the voice coil 28 operates. A coil 46 provided on core 45 is connected to the B-plus terminal 25 through resistor 47. This coil may be the energizing coil of an electromagnetic speaker and may also act as a noise cancelling or suppression coil. The coil 46 is energized in parallel with the transistor stage and the value of the resistor 47 is selected so that noise signals induce flux in the coil 28 sufficient to oppose and suppress or cancel noise signals supplied thereto from the stage 15.

In the alternate embodiment shown in FIG. 4, there is provided a radio receiver circuit like those described in FIGS. 2 and 3, and having a noise suppressor inductively coupled to the speaker. The coil 48 is grounded at one end and is connected through a capacitor 49 to the B-plus terminal 25. The coil 48 is inductively coupled to the voice coil 28 of speaker 29. Audio signals are applied to voice coil 28 from autotransformer 31 driven by a transistor power amplifier output stage 15. The capacitor 49 couples the suppressor coil 48 to the B-plus power supply terminal 25 and applies audio frequency noise components therefrom to the coil 48. The coil 48 is mounted in proximity to the voice coil 28 so that noise components are inductively applied thereto in opposite phase relationship to noise signals supplied to the coil 28 from transistor 15 and the noise pulses are therefore cancelled.

In the alternate embodiment of the invention shown in FIG. 5, there is provided a tetrode audio frequency amplifier stage like that shown in FIG. 1. This includes a tetrode vacuum tube 51 which applies audio signals to primary winding 52 of a transformer 53. Winding 52 is connected to suppressor winding 58 and the junction therebetween is connected to B-plus terminal 25. The winding 58 is connected through resistor 61 to ground. The resistor 61 is selected to have a value such that current flowing through the coil 58 has the same ampere-turns as the current flowing from the B-plus power supply through the primary winding 52. Consequently, for a steady state condition with no signal from the amplifier, merely a direct current of constant magnitude flows through the coil 58 and resistor 61 so that no flux is induced into the core of the transformer by the coil 58. However, when noise signals appear from the D.C. voltage source and in the winding 52, the noise signals from the D.C. supply cause exactly the same effects in the windings 58 and 52 so that this noise is cancelled and is not transmitted to the secondary windings. The signal undistorted by noise is amplified by the push-pull transistor output stage and supplied to the voice coil of loudspeaker 60. The transistor output stage of FIG. 5 is of the push-pull type with the transformer secondary windings 54 and 55 feeding transistors 56 and 57 respectively. The transistors are coupled to a common output transformer 59 which feeds the loudspeaker 60. B-plus potential for the emitters of the transistors is applied to the center tap of the primary winding of transformer 59 and bias for the base electrodes of the transistors is produced by the voltage divider including resistors 62 and 63. Resistor 62 may be a thermistor to provide temperature compensation of the transistor stage, and resistor 63 may be variable to adjust the bias for the desired operating characteristics.

The audio output stages in accordance with the invention which have been described have been found to be highly satisfactory in reducing the effect of noise pulses which appear at the battery-generator of the automobile electrical system so they do not appear as audio pulses in the loudspeaker of the receiver. By using the noise cancelling circuits described, it is possible to reduce the amount of filtering required and, at the same time, provide reduction in the noise at the receiver output. The cost of the noise cancelling windings is small, and is more than offset by the savings in the filter elements required so that a substantial over-all reduction in cost is effected.

I claim:

1. In a radio receiver for use in an automobile having a battery generator direct current source and in which random noise components are superimposed on the voltage of the source, the combination including, an audio output stage including a transistor having output electrodes, a loudspeaker having first and second winding sections, potential supply means for connection to the direct current source of an automobile and providing such direct current potential, an output circuit connected to said potential supply means and including said first loudspeaker winding section and said output electrodes of said transistor, said output circuit applying direct current from said potential supply means to said output electrodes of said transistor through said first winding section, said output circuit applying audio signals from said transistor to said first winding section, and a second circuit connected to said potential supply means and including said second loudspeaker winding section, said second circuit providing direct current from said potential supply means through said second winding section which produces a field opposing the field produced by the current from said potential supply means in said first winding section.

2. The combination of claim 1 wherein said second circuit includes resistor means controlling the current therein.

3. In a radio receiver, the combination including, an audio output stage including a transistor having output electrodes, a loudspeaker having first and second winding sections, potential supply means for providing a direct current potential, an output circuit connected to said potential supply means and including said first loudspeaker winding section and said output electrodes of said transistor and providing direct current from said potential supply means through said first winding section to said output electrodes of said transistor, said output circuit applying audio signals from said output electrodes of said transistor to said first winding section, and a second circuit connected to said potential supply means and including said second loudspeaker winding section, said second circuit providing direct current from said potential supply means through said second winding section, whereby said second winding section produces a field opposing the field produced by the direct current in said first winding section.

4. In an automobile radio receiver the combination including, a single ended audio output stage including a transistor having base, emitter and collector electrodes, means applying audio signals to said base electrode of said transistor, a loudspeaker having first and second winding sections, potential supply means for connection to the direct current electrical system of an automobile and providing such direct current potential having noise pulses superimposed thereon, an output circuit connected to said potential supply means and including said first loudspeaker winding section and said emitter and collector electrodes of said transistor, said output circuit applying direct current from said potential supply means to said emitter and collector electrodes of said transistor through said first winding section and audio signals from the emitter and collector electrodes of said transistor to said first winding section of said loudspeaker and a second circuit connected to said potential supply means and including said second loudspeaker winding section, said second circuit providing direct current having noise pulses therewith through said second winding section which produces a field opposing the field produced by the current from said potential supply means in said first winding section.

References Cited by the Examiner

UNITED STATES PATENTS

| | | | |
|---|---|---|---|
| 1,969,657 | 8/34 | McCaa | 325—474 X |
| 1,977,469 | 10/34 | Bussard | 325—493 |
| 2,205,365 | 6/40 | Schwaen | 325—475 |
| 2,476,174 | 7/49 | Adler et al. | 330—196 |
| 2,810,071 | 10/57 | Race | 330—22 |

DAVID G. REDINBAUGH, *Primary Examiner.*

SAMUEL B. PRITCHARD, *Examiner.*